United States Patent [19]

Sase

[11] Patent Number: 6,108,803
[45] Date of Patent: Aug. 22, 2000

[54] MEMORY CELL CIRCUIT FOR EXECUTING SPECIFIC TESTS ON MEMORY CELLS THAT HAVE BEEN DESIGNATED BY ADDRESS DATA

[75] Inventor: Ichiro Sase, Tokyo, Japan

[73] Assignee: Oki Electric Industry Co., Ltd., Tokyo, Japan

[21] Appl. No.: 09/066,339

[22] PCT Filed: Jul. 24, 1997

[86] PCT No.: PCT/JP97/02565

§ 371 Date: Apr. 28, 1998

§ 102(e) Date: Apr. 28, 1998

[87] PCT Pub. No.: WO98/12705

PCT Pub. Date: Mar. 26, 1998

[30] Foreign Application Priority Data

Sep. 17, 1996 [JP] Japan .................................. 8-245194

[51] Int. Cl.[7] .................................................. G01R 31/28
[52] U.S. Cl. ............................................ 714/718; 711/220
[58] Field of Search ..................................... 714/718, 719, 714/720, 768, 53; 711/220

[56] References Cited

U.S. PATENT DOCUMENTS

| | | |
|---|---|---|
| 4,429,389 | 1/1984 | Catiller ....................................... 371/21 |
| 4,876,685 | 10/1989 | Rich ......................................... 371/21.6 |
| 5,018,145 | 5/1991 | Kikuchi et al. ............................ 371/27 |
| 5,321,701 | 6/1994 | Raymond et al. ......................... 371/27 |
| 5,357,620 | 10/1994 | Suzuki ..................................... 395/400 |
| 5,386,523 | 1/1995 | Crook et al. ............................. 395/400 |

FOREIGN PATENT DOCUMENTS

| | | | |
|---|---|---|---|
| 63-191977 | 9/1988 | Japan .............................. G01R 31/28 |
| 2-223100 | 5/1990 | Japan .............................. G11C 29/00 |
| 2-202640 | 10/1990 | Japan .............................. G06F 11/22 |
| 3-3200 | 9/1991 | Japan .............................. G11C 29/00 |

Primary Examiner—Albert De Cady
Assistant Examiner—Samuel Lin
Attorney, Agent, or Firm—Venable; Robert J. Frank; Allen Wood

[57] ABSTRACT

A memory circuit, provided with address signal generating arrangement that includes first counter 72 for outputting first output data Q1 sequentially designating address signals for memory cells under test in a memory 10, a second counter 74 for outputting second output data Q2 used to designate address signals for each memory cell of the memory 10 for every cell under test, an output control circuit 76 for selectively outputting the second output data Q2 as third output data Q3 depending on a control signal INH, and a computing circuit 78 for carrying out computations based on the first output data Q1 and the third output data Q3, and generating address signals Q4. In this way, a memory receives address signals based on a test pattern, and a tester exclusively for memory tests is not required.

15 Claims, 8 Drawing Sheets

MEMORY CELL CIRCUIT FOR EXECUTING SPECIFIC TESTS ON MEMORY CELLS THAT HAVE BEEN DESIGNATED BY ADDRESS DATA

BACKGROUND OF THE INVENTION

The present invention relates to a semiconductor memory device (hereafter called RAM) capable of being read and written to, and to a memory test circuit for performing tests on products having such RAM installed.

Conventionally, a memory test circuit has been used to test the RAM of a DRAM, etc. The RAM tests are performed taking into consideration the interrelation between each bit (memory cell) stored in a plurality of memory cells constituting the RAM, and the operation of a decoder built into the memory circuit. Therefore, the RAM tests perform a test on each memory cell by designating memory cells by successively inputting address signals pointing to the memory cells constituting the RAM in a specified sequence. There are many sequential patterns (hereafter called test patterns) for indicating each memory cell address. For example, test patterns known as "CHECKERBOARD," "MARCHING," "GALLOPING," etc.

A conventional memory test circuit for testing a RAM is shown in FIG. 8. This memory circuit 1 is comprised of a memory 10, an internal clock control circuit 12 (hereafter called an internal clock circuit or clock circuit), a first selector 14, a second selector 16 and a third selector 18.

The memory 10 is comprised of a RAM, and has address input terminals 20, a read signal input terminal 22, a write signal input terminal 24 and a data input/output terminal 26. An address signal An is input to the address input terminals 20 by a tester (not shown) exlusively for an external memory test of the memory circuit 1. A read signal is input to the read signal input terminal 22 and a write signal is input to the write signal input terminal 24.

The internal clock control circuit 12 is provided to drive the memory circuit 10 at the time of normal operation. The internal clock control circuit 12 is provided with a test signal input terminal 28, address signal output terminals 30, a read signal output terminal 32, a write signal output terminal 34 and a data terminal 36. The address signal output terminals 30 of the internal clock control circuit 12 are connected to the address input terminals 20 of the memory 10 via the first selector 14. During normal operation, memory cells within the memory 10 are designated by an address signal output from the address signal output terminals 30.

The read signal output terminal 32 of the internal clock control circuit 12 is connected to the read signal input terminal 22 of the memory 10 via the second selector 16. During normal operation, a read signal is output from the read signal output terminal 32.

The write signal output terminal 34 of the internal clock control circuit 12 is connected to the write signal input terminal 24 of the memory 10 via the third selector 18. During normal operation, a write signal is output from the write signal output terminal 34.

The data terminal 36 of the internal clock control circuit 12 is connected to an external data bus 38 and to the data input/output terminal 26 of the memory 10. During normal operation, data output from the data terminal 36 is input from the data input/output terminal 26 to the memory 10 in response to a write signal output from the write signal output terminal 34 (for example, when this write signal goes to a high level). Also during normal operation, data output from the data input/output terminal 26 of the memory 10 is input from the data terminal 36 to the internal clock control circuit 12 in response to a read signal output from the read signal output terminal 32 (for example, when the read signal goes to a high level).

A test signal RAMTEST is input to the test signal input terminal 28 of the internal clock control circuit 12. The potential level of the test signal RAMTEST is a low potential level (hereinafter termed level "0") during normal operation and a high level (hereinafter termed level "1") during testing. During testing, the output of the data terminal 36 of the internal clock control circuit 12 can have one of three states (level "0", level "1" or a high impedance state) and becomes a high impedance state (Hi-Z state) in response to this test signal RAMTEST. As a result, the internal clock control circuit 12 is disconnected from the memory 10 at the time of testing.

The first selector 14 is provided with first input terminals 40, second input terminals 42, a switch terminal 44, and output terminals 46. The first input terminals 40 are connected to the address signal output terminals 30 of the internal clock control circuit 12. An address signal An from outside the memory 10 is input to the second input terminals 42. The test signal RAMTEST from outside the memory circuit 1 is input to the switch terminal 44. The output terminals 46 are connected to the address input terminals 20 of the memory 10.

The first selector 14 outputs an address signal input from the first input terminals 40 to the output terminals 46 at the time of normal operation (when the test signal RAMTEST is at level "0"). At the time of testing (when the test signal RAMTEST is at level "1"), the first selector 14 outputs an address signal An input from the second input terminals 42 to the terminals 46.

The second selector 16 is provided with a first input terminal 50, a second input terminal 52, a switch terminal 54, and an output terminal 56. The first input terminal 50 is connected to the read signal output terminal 32 of the internal clock control circuit 12. A read signal RD from outside the memory 10 is input to the second input terminal 52. The test signal RAMTEST from outside the memory circuit 1 is input to the switch terminal 54. The output terminal 46 is connected to the read signal input terminal 22 of the memory 10.

The second selector 16 outputs a read signal input from the first input terminal 50 to the output terminal 56 at the time of normal operation (when the test signal RAMTEST is at level "0"). On the other hand, at the time of testing (when the test signal RAMTEST is at level "1"), the second selector 16 outputs a read signal RD input from the second input terminal 52 to the output terminal 56.

The third selector 18 is provided with a first input terminal 60, a second input terminal 62, a switch terminal 64, and an output terminal 66. The first input terminal 60 is connected to the write signal output terminal 34 of the internal clock control circuit 12. A write signal WR from outside the memory 10 is input to the second input terminal 62. The test signal RAMTEST from outside the memory circuit 1 is input to the switch terminal 64. The output terminal 66 is connected to the write signal input terminal 24 of the memory 10.

The third selector 18 outputs a write signal input from the first input terminal 60 to the output terminal 66 at the time of normal operation (when the test signal RAMTEST is at level "0"). On the other hand, at the time of testing (when the test signal RAMTEST is at level "1"), the third selector 18 outputs a write signal WR input from the second input terminal 62 to the output terminal 66.

The operation of this memory circuit 1 will now be described below. The description will be given for a case where "GALLOPING" is used as the test pattern. The memory 10 is assumed to be provided with N memory cells (where N is a positive integer). In the case of this description, the number of memory cells N is the same as the number of words (that is the number of words is N).

When testing the memory circuit 1, the test signal RAMTEST is set to level "1." As a result, the data terminal 36 of the internal clock control circuit 12 is put in a high impedance state. Also, the first selector 14 is set so as to output the address signal An input to the second input terminals 42 from the output terminals 46. The second selector 16 is set so as to output a read signal RD input to the second input terminal 52 from the output terminal 56. The third selector 18 is set so as to output a write signal WR input to the second input terminal 62 from the output terminal 66. Accordingly, at the time of testing the memory 10 is driven by signals input from outside the memory circuit 1.

In this state, a "GALLOPING" test is carried out using the following procedure.

(a) First of all, the write signal WR is input from outside the memory 10, N memory cells of the memory 10 are sequentially designated from the address signal An, and level "0" is transferred from the external data bus 38 as data. In this way level "0" is written to all N memory cells of the memory 10.

(b) Next, level "1" is transferred to the external data bus 38 as data. Also, a write signal WR is input from outside the memory circuit 1 and level "1" is written as data to a memory cell among the designated memory cells that is the memory cell under test (the memory cell that is currently being tested). Here, a memory cell with address 0 is the first memory cell to be made the memory cell under test.

(c) Next, in a state where only the cell under test having address 0 from among the memory cells has had level "1" written as data, data stored in certain memory cells is read out.

That is, data stored in the memory cell having address 1, which is the subsequent address to the address of the cell under test (address 0), is read out. This read operation is carried out by designating address 1 using address signal An at the same time as inputting a read signal RD. Level "0" is written as data to the memory cell having address 1 using the above described operation (a). Accordingly, if the memory 10 is operating normally, level "0" is read as data from the memory cell having address 1.

Next, data that has been stored in the cell under test having address 0 is read out. The cell under test having address 0 has had level "1" written as data, by the above described operation (b). Accordingly, if the memory 10 is operating normally, level "1" will be read out of the cell under test having address 0 as data.

Next, the data stored in the memory cell having address 1, which is the subsequent address to the cell under test, is read out again. Level "0" has been written as data to the memory cell having address 1, by the above described operation (a), and so if the memory 10 is operating normally, level "0" will be read as data from the memory cell having address 1.

Next, data stored in a memory cell having address 2 subsequent to address 1 is read out. Level "0" has also been written to the memory cell having address 2 using the above described operation (a), and so if the memory 10 is operating normally, level "0" will be read out as data from the memory cell having address 2.

The data stored at the cell under test having address 0 is then read out. Level "1" has been written to the cell under test at address 0 using the above described operation (b), and so if the memory 10 is operating normally, level "1" will be read out from the cell under test having address 0.

Next, the data stored in the memory cell having address 2 is read out again. Level "0" has been written as data to the memory cell having address 2, by the above described operation (a), and so if the memory 10 is operating normally, level "0" will be read as data from the memory cell having address 2.

Next, data stored in a memory cell having address 3 is read out. Level "0" has been written to the memory cell having address 3 using the above described operation (a), and so if the memory 10 is operating normally, level "0" will be read out as data from the memory cell having address 3.

After that, the data stored in each memory cell are read in a similar manner, for address 0, address 3, address 4, address 0, address 4, address 5, and so on, sequentially up to address N. The test pattern for "GALLOPING" is shown in FIG. 9.

In FIG. 9, the numerals represent the memory cell addresses, W represents write and R represents read. Also, the figure on the left hand side of "W" or "R" represents the data value of the written or read. When the cell under test has address 0, after the memory cell having address 1 has been read once, reading is carried out by designating memory cells in the order address 0, address 1, address 2, address 0, address 2, address 3, address 0, address 3, address 4, . . . address 0, address N−1, address N. If the address is considered as a loop, then if the total number of memory cells in the memory 10 is N. a memory cell having address N can be considered to be one cell before the memory cell under test having an address of 0. Further, address N+1 is equivalent to address 0.

(d) Next, level "0" is written as data to the memory cell under test having address 0.

(e) Level "1" is then written as data to the memory cell having address 1. As a result, the memory cell having address 1 becomes the cell under test.

The sequence of designating the cell under test is shown in FIG. 10. A memory cell is designated using an X decoder and Y decoder not shown in the memory 10. That is, each memory cell is designated from the input address signal An by designating an X coordinate (the horizontal direction in FIG. 10) using the X decoder and designating a Y coordinate (the vertical direction in FIG. 10) using the Y decoder. In the case of FIG. 10, the output of the X decoder (that is the X coordinate) is changed from a start point to an end point while the output of the Y decoder (the Y coordinate) is fixed, and the output of the Y decoder is then changed sequentially. For each change in the Y decoder, the output of the X decoder is changed from the start point to the end point.

(f) Next, when the memory cell with address 1 has been made the cell under test, each memory cell is read according to the test pattern, in a similar operation to that described in (c) above. In this case, reading is carried out by sequentially designating the memory cells in the order of address 1, address 2, address 3, address 1, address 3, address 4, address 1, address 4, address 5, . . . address 1, address N, address 0.

(g) The data stored in the memory cells is read out according to the test pattern using the same operation as described above in (c), until the cell under test becomes the memory cell with address N by sequentially incrementing the memory cell address by one. When the cell under test has address N, reading is carried out up to the memory cell having address N–1, which is one address before the address of the cell under test.

In reading as described above, when level "1" is read as data stored in the cell under test and level "0" is read as data stored in memory cells other than the cell under test, it is confirmed that the memory 10 is operating normally. Conversely, when level "0" is read as data stored in the cell under test and level "1" is read as data stored in memory cells other than the cell under test, it is confirmed that the memory 10 is operating abnormally.

(h) Next, using the operations (a)–(g) described above, the same operation is carried out with a complement pattern of alternate level "1" and level "0" as data. At this time, if the memory 10 is operating normally, level "0" is read as data from the cell under test while level "1" is read as data from memory cells other than the cell under test.

In this way, in the case of a "GALLOPING" test pattern, for one cell under test, reading of three memory cells made up of the cell under test and two consecutive memory cells (for example, memory cells having address 2, address 3) as one set is carried out for every two consecutive memory cells. As a result, if the number of memory cells is N, 3×N test patterns are needed for one cell under test. Because all of the N memory cells are sequentially made the cell under test, $3 \times N^2$ test patterns become necessary. Also, with a Complement Pattern, since testing is carried out with level "0" and level "1" respectively, written to the cell under test as data, $3 \times N^2 \times 2$ test patterns are necessary as a "GALLOPING" test pattern.

Thus in the conventional memory circuit 1, $3 \times N^2 \times 2$ test patterns are necessary as a "GALLOPING" test pattern, for example. With any type of test pattern, the test pattern, that is the number of times an address is designated, is proportional to the square of the memory cells. Accordingly, if the memory circuit 1 is made large in scale (the number of memory cells is increased) the number of test patterns increases in proportion to the square of the memory cells, and the number of test patterns becomes enormously large. This means that when storing the address data for this test pattern in memory, if a circuit is prepared to output the address data sequentially depending on the test of the memory circuit 1, there is a problem that the memory capacity for storing the address data becomes enormous.

Further, in order to reduce this memory capacity, a tester for executing the tests becomes necessary, having a computing function for generating the test pattern. This then means that when testing an LSI chip having the memory 10 and the logic circuit on a single chip, an exclusive tester for testing the memory 10 and an exclusive tester for testing the logic circuit are required as a tester exclusively for testing. Therefore, there is a problem that it becomes impossible to carry out testing using a single type of tester when the memory and the logic circuit have been integrated into a single chip.

SUMMARY OF THE INVENTION

An object of the present invention is therefore to provide a memory circuit in which test pattern address data are store in memory, and which can enable a reduction in the memory capacity used to store the address data when a circuit is prepared to sequentially output the data depending on the test of the memory circuit 1.

A further object of the present invention is to provide a memory circuit does not use a tester exclusively for the memory.

An aspect exemplifying the present invention is a memory test circuit, for a memory circuit having a plurality of memory cells, for executing specified tests on memory cells that have been designated by an input address signal, the memory test circuit having a first address generating circuit, being input with a first clock signal, sequentially generating address signals for designating a memory cell under test for the plurality of memory cells of the memory circuit in response to the first clock signal and outputting the address signals as first output data, a second address generating circuit, being input with a second clock signal, sequentially generating address signals for designating each memory cell of the memory circuit involved in the test in response to the second clock signal and outputting the address signals as second output data, an output control circuit, being input with a control signal, controlling transmission of the second output data in response to the control signal and outputting the second data as third output data, and a computing circuit, input with the first output data and third output data, carrying out computation based on the first output data and third output data, and outputting the result of computation as an output address signal.

DESCRIPTION OF THE PREFERRED EMBODIMENTS

Figure 1:
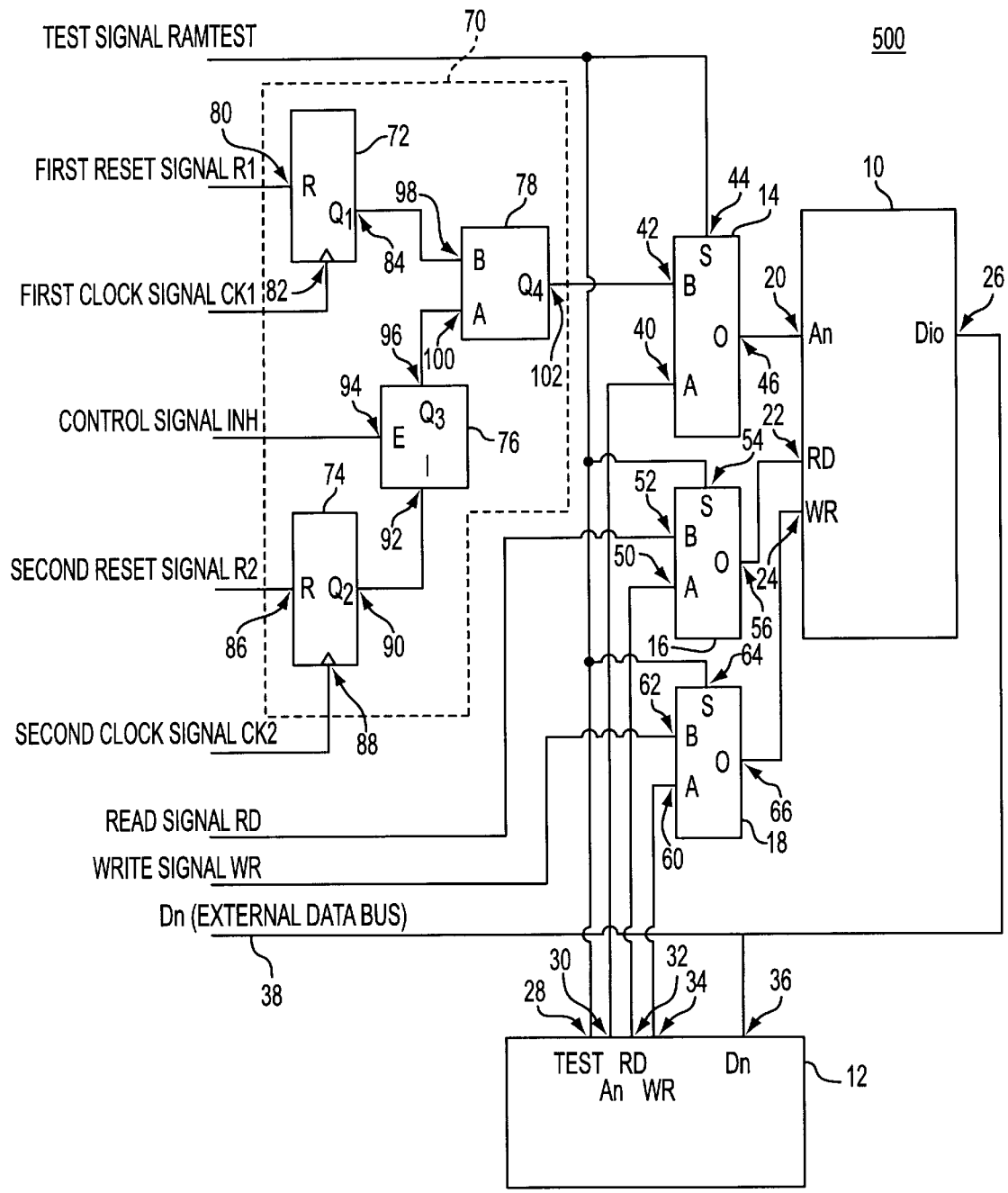
FIG. 1 is a schematic block diagram of a memory circuit of a first embodiment of the present invention.
Figure 8:
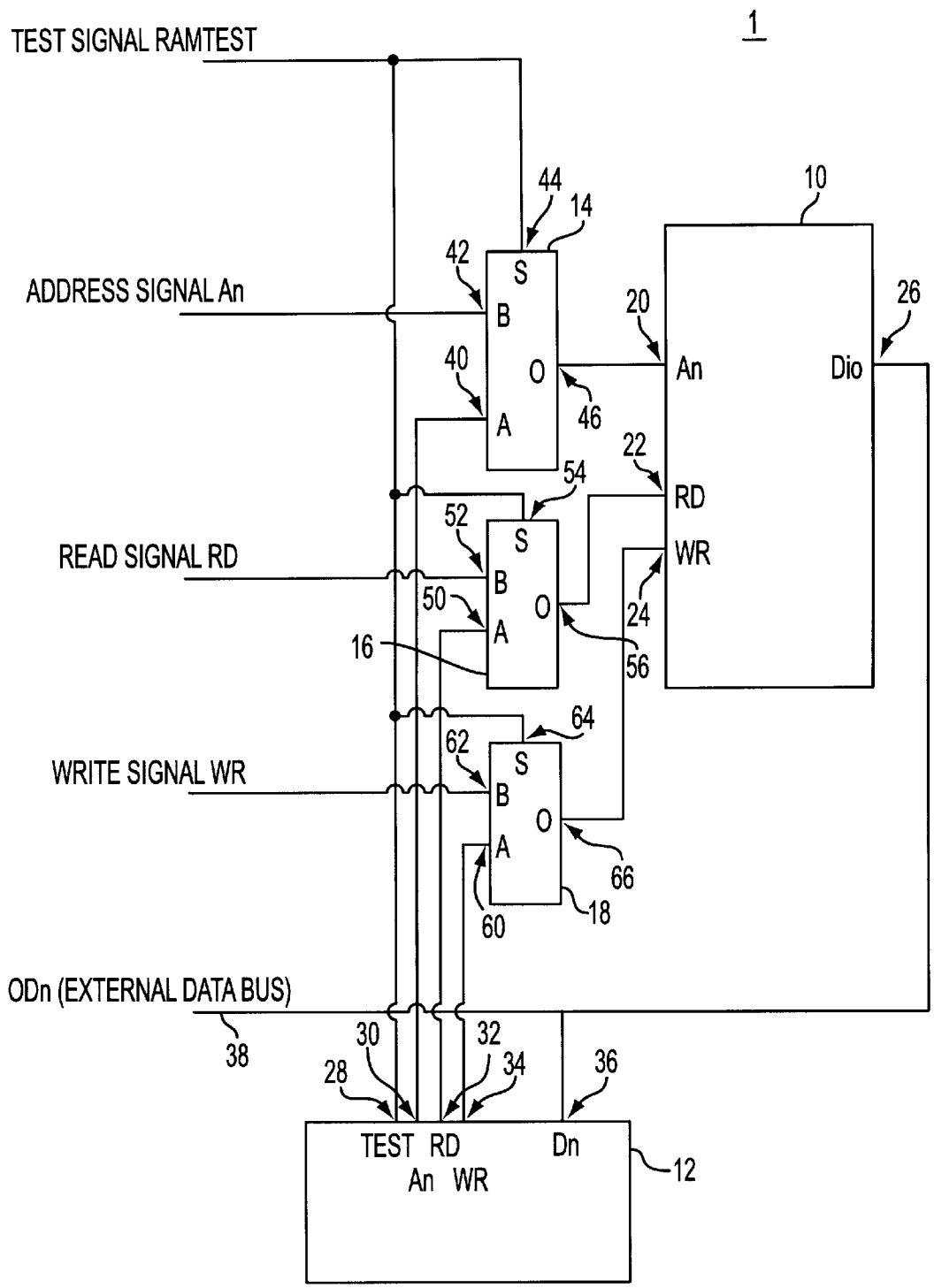
FIG. 8 is a schematic block diagram of a conventional memory circuit.

A memory circuit of the present invention will now be described below using the drawings. The reference drawings do no more than briefly illustrate size, shape and positional relationship of each structural component to the extent that the present invention can be understood. Accordingly, the present invention is not limited only to the illustrated examples. Further, with respect to parts that are the same as those in the memory circuit 1 show n in FIG. 8, they will be given the same reference numerals. FIG. 1 is a schematic block diagram of a memory circuit of a first embodiment of the present invention.

The memory circuit 500 of FIG. 1 comprises a memory 10, an internal clock control circuit 12, a first selector 14, a second selector 16 and a third selector 18. The operations of each of these components are the same as those of a conventional memory circuit.

Further, the memory circuit 500 is provided with address signal generating means 70. The output of the address signal generating means 70 is connected to the second input terminals 42 of the first selector 14 input with an address signal. A first reset signal R1, a first clock signal CK1, a control signal INH, a second reset signal R2, and a second clock signal CK2 are input to the address signal generating means 70. These signals are generated by a tester (not shown) exclusively for a logic circuit external to the memory circuit 500.

The address signal generating means 70 comprises a first counter 72 constituting a first address generating circuit, a second counter 74 constituting a second address generating circuit, an output control circuit 76, and a computing circuit 78.

The first counter 72 sequentially outputs address signals designating cells under test in the memory 10, as first output data Q1. The second counter 74 outputs memory address signals designating memory cells of the memory 10 for every designation of a cell under test address, as second output data Q2. The output control circuit 76 selectively outputs the second output data Q2 as third output data Q3 depending on the control signal INH. The computing circuit 78 carries out computation based on the first output data Q1 and the third output data Q3. The computation result Q4 forms the output of the address signal generating means 70.

The first counter 72 has a first reset signal input terminal 80, a first clock signal input terminal 82, and output terminals 84. A first reset signal R1 is input to the first reset signal input terminal 80. A first clock signal is input to the first clock signal input terminal 82. The output terminals 84 are connected to the computing circuit 78.

The first counter 72 counts one for every input of one pulse of a pulse signal input as the first clock signal CK1, and resets the counter value in response to the first reset signal R1. In this way, the first counter 72 sequentially outputs addresses designating cells under test for the memory 10, as first output data Q1.

The second counter 74 has a second reset signal input terminal 86, a second clock signal input terminal 88, and an output terminal 90. A second reset signal R2 is input to the second reset signal input terminal 86. A second clock signal is input to the second clock signal input terminal 88. The output terminals 90 are connected to the output control circuit 76.

The second counter 74 counts one for every input of one pulse of a pulse signal input as the second clock signal CK2, and resets the counter value in response to the second reset signal R2. In this way, the second counter 74 sequentially outputs addresses that can be used for designating cells under test for the memory 10, as second output data Q2.

The output control circuit 76 has input terminals 92, a control terminal 94 and output terminals 96. The input terminals 92 are connected to the output terminals 90 of the second counter 74. A control signal INH is input to the control terminal 94. The output terminals 96 are connected to the computing circuit 78.

The output control circuit 76 selectively outputs second output data Q2 that has been input from the input terminals 92 as third output data Q3 in response to the control signal INH that has been input to the control terminal 94. That is, when the control signal INH is level "0" second output data Q2 are output, and when the control signal INH is level "1" the second output data Q2 are not output (in this case it is the same outputting 0 as data).

The computing circuit 78 has first input terminals 98, second input terminals 100, and output terminals 102. The first input terminals 98 are connected to the output terminals 84 of the first counter 72. The second input terminals 100 are connected to the output control terminals 96 of the output control circuit 76. The output terminals 102 are connected to the second input terminals 42 of the first selector 14.

The computing circuit 78 carries out computation based on the first output data Q1 and the third output data Q3, the result of computation Q4 being output from output terminals 102 as an address signal.

Figure 2:
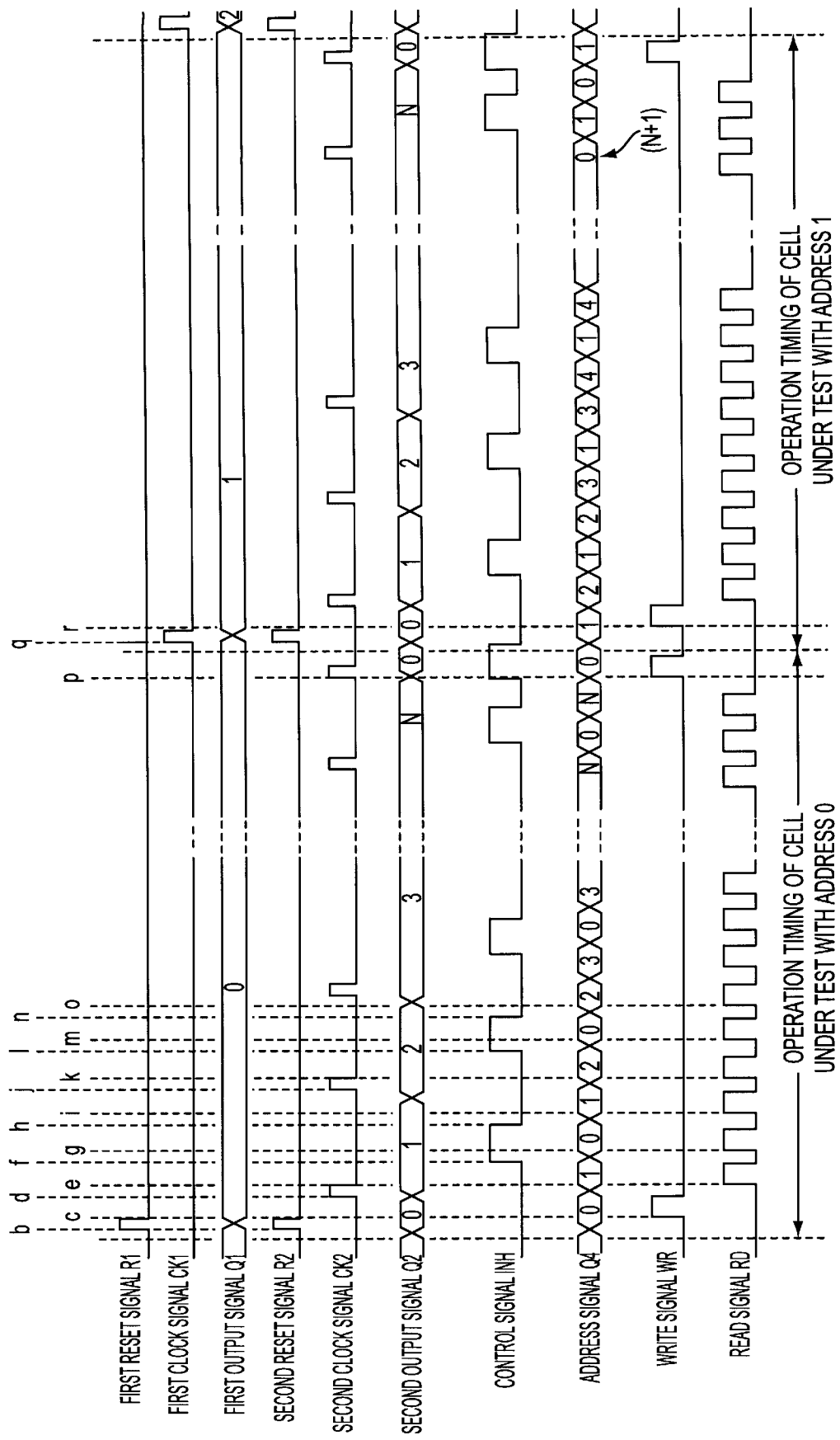
FIG. 2 is a timing chart for describing the operation of the memory circuit of the first embodiment of the present invention.

The operation of the memory circuit 500 of the first embodiment of the present invention having the above described construction will now be described. FIG. 2 is a timing chart for describing the operation of the memory circuit 500. FIG. 2 is for the case of a "GALLOPING" test pattern of the memory circuit 500. The following headings (b)–(r) respectively correspond to b–r showing times in FIG. 2.

(a) First of all, when the memory 10 is tested a test signal RAMTEST is set to level "1." As a result of this, the output of the data terminal 36 of the internal clock control circuit 12 is put in a high impedance state (Hi-Z state). Accordingly, data from the external data bus 38 is input to the data input/output terminal 26 of the memory 10.

The first selector 14 outputs address signal Q4 that has been input to the second input terminals 42 from the output terminals 46. The second selector 16 outputs a read signal RD that has been input to the second input terminal 52 from the output terminal 56. The third selector 18 outputs a write signal WR that has been input to the second input terminal 62 from the output terminal 66. Thus, the memory 10 is driven using signals from a tester for a logic circuit that is external to the memory circuit 500.

Signals from the tester exclusively for a logic circuit that is external to the memory circuit 500, namely a first reset signal R1, a first clock signal CK1, a second reset signal R2, a second clock signal CK2 and a control signal INH, are respectively input at a timing determined by a program in the tester.

First, the first reset signal R1 and second reset signal R2 at level "1" are respectively input to the first reset signal input terminal 80 of the first counter 72 and the second reset signal input 86 of the second counter 74. This causes the first counter 72 and the second counter 74 to be reset. In this state, the first counter 72 and the second counter 74 both output data designating address 0.

Next, level "0" is written as data to all the memory cells of the memory 10. When this level "0" data is written, the write signal WR is first set to level "1" with the external data bus 38 still at level "0." This write signal WR is input to the write signal input terminal 24 of the memory 10 via the third selector 18. As a result, level "0" is written as data to the memory cell of the memory 10 having address 0 being designated by the address at this point in time.

Next, one pulse of the first clock signal CK1 at level "1" is input to the first clock signal input terminal 82 of the first counter 72. This causes the first output data Q1 of the first counter 72 to count up by one only. As a result, the designated memory cell address becomes address 1.

Next, the write signal WR at level "1" is input with the external data bus 38 still at level "0." This causes level "0" to be written as data to the memory cell having address 1.

After that, the level "1" first clock signal CK1 and the level "1" write signal WR are alternately input, and level "0" is written as data to all memory cells.

(b) Next, the level "1" first reset signal R1 is input again to the first reset signal input terminal 80 of the first counter 72. As a result of this, the first output data Q1 constituting the output of the first counter 72 is initialized (that is, it becomes output data designating address 0). This first output data Q1 designating address 0 is input to the first input terminals 98 of the computing circuit 78.

Further, the level "1" second reset signal R2 is input to the second reset signal input terminal 86 of the second counter 74. As a result, second output data Q2 constituting the output of the second counter 74 is initialized (that is, it becomes output data designating address 0).

The level "0" control signal INH is input to the control terminal 94 of the output control circuit 76. This causes the second output data Q2 that has been input to the input terminals 92 to be output as third output data Q3 from the output control terminals 96 of the output control circuit 76. This third output data Q3 is input to the second input terminals 100 of the computing circuit 78.

The first output data Q1 designating address 0 is input to the computing circuit 78 from the first input terminals 98, and the third output data Q3 designating address 0 is input to the computing circuit 78 from the second input terminals 100. As a result, the computing circuit 78 outputs an addition result of adding address 0 and address 0 (in this case it becomes address 0) as address signal Q4. This address signal Q4 is input to the address input terminals 20 of the memory 10 via the first selector 14. This results in the memory cell having address 0 in the memory 10 being designated as the cell under test.

(c) Next, the external data bus 38 is set to level "1" and the write signal WR is set to level "1." This write signal WR is input to the write signal input terminal 24 of the memory 10, via the third selector 18. As a result, level "1" is written as data to the cell under test being designated by the address at that point in time, that is, the memory cell of the memory 10 having address 0.

(d) When the memory cell under test is address 0, the read operation of each memory cell other than the cell under test is tested. To do this, first of all one pulse of the second clock signal CK2 at level "1" is input to the of the second counter 74. This causes the second output data Q2 of the second counter 74 to count up by one only. Accordingly, the second output data Q2 now designates address 1. This second output data Q2 is input to the input terminals 92 of the output control circuit 76. A level "0" control signal INH is input to the control terminal 94 of the output control circuit 76. As a result of this, the second output data Q2 are input from the output control terminals 96 of the output control circuit 76 to the second input terminal 100 of the computing circuit 78 as third output data Q3.

The computing circuit 78 adds the first output data Q1 designating address 0 being input from the first input terminals 98 and the third output data Q3 designating address 1 that has been input from the second input terminals 100. Address signal Q4 designating address 1 is output from the output terminals 102 as the result of addition. This address signal Q4 is input to the memory cell of the memory 10 having address 1, via the first selector 14.

(e) When the memory cell having address 1 is being designated, a level "1" read signal RD is input to the read signal input terminal 22 of the memory 10 through the second selector 16. In this way, if the memory 10 is operating normally, data "0" that has been stored in the memory cell having address 1 being designated by the address signal is read on to the external data bus 38 from the data input/output terminal 26.

(f) After that, a level "1" control signal INH is input to the control terminal 94 of the output control circuit 76. In this way, the output control circuit 76 is put in an output inhibited state.

Accordingly, only the address 0 address from the first input terminal 98 is input to the computing circuit 78. This means that the computing circuit 78 outputs an address signal Q4 of address 0. In this way, the address signal Q4 is input to the address input terminals 20 of the memory 10 via the first selector 14, and the memory cell of the memory 10 having address 10 (the cell under test) is designated again.

(g) When the cell under test of address 0 is being selected, a level "1" read signal RD is input to the read signal input terminal 22 of the memory 10, through the second selector 16. As a result of this, if the memory 10 is operating normally, data "1" that has been stored in the memory cell having address 0 being designated by the address signal will be read on to the external data bus 38 from the data input/output terminal 26.

(h) Next, a level "0" control signal INH is input to the control terminal 94 of the output control circuit 76. As a result, the output control circuit 76 outputs the second output data Q2 for designating address 1 that has been input from the input terminals 92 from the output control terminals 96 as third output data Q3.

Accordingly, the computing circuit 78 adds together the first output data Q1 for designating address 0 input from the first input terminal 98 and the output data Q3 for designating address 1 input from the second input terminal 100. Address signal Q4 designating address 1 is output from the output terminal 102 as the result of addition. This address signal Q4 is input to the address input terminals 20 of the memory 10 via the first selector 14. As a result, the memory cell of the memory 10 having address 1 is designated again.

(i) When the memory cell having address 1 is being designated, a level "1" read signal RD is input to the read signal input terminal 22 of the memory 10 through the second selector 16. In this way, if the memory 10 is operating normally, data "0" that has been stored in the memory cell having address 1 being designated by the address signal is read on to the external data bus 38 from the data input/output terminal 26.

(j) One pulse of the second clock signal CK2 at level "1" is input to the second clock signal input terminal 88 of the second counter 74. This causes the second output data Q2 of the second counter 74 to count up by one only. Accordingly, the second output data Q now designates address 2. This second output data Q2 is input to the input terminals 92 of the output control circuit 76. A level "0" control signal INH is input to the control terminal 94 of the output control circuit 76. As a result of this, the second output data Q2 designating address 2 are input from the output control terminals 96 of the output control circuit 76 to the second input terminals 100 of the computing circuit 78 as third output data Q3.

The computing circuit 78 adds the first output data Q1 designating address 0 input from the first input terminals 98 to the third output data Q3 designating address 2 input from the second input terminals 100. Address signal Q4 designating address 2 is output from the output terminals 102 as the result of this addition. This address signal Q4 is input to the address input terminals 20 of the memory 10, via the first selector 14. As a result, the memory cell of the memory 10 having address 2 is designated.

(k) When the memory cell having address 2 is being designated, a level "1" read signal RD is input to the read signal input terminal 22 of the memory 10 through the second selector 16. In this way, if the memory 10 is operating normally, data "0" that has been stored in the memory cell having address 2 being designated by the address signal is read on to the external data bus 38 from the data input/output terminal 26.

(l) A level "1" control signal INH is then input to the control terminal 94 of the output control circuit 76. In this way, the output control circuit 76 is put in an output inhibited state.

Accordingly, only the address 0 address from the first input terminals 98 is input to the computing circuit 78. This means that the computing circuit 78 outputs an address signal Q4 of address 0. In this way, the address signal Q4 is input to the address input terminals 20 of the memory 10 via the first selector 14, and the memory cell of the memory 10 having address 10 (the cell under test) is designated again.

(m) When the cell under test of address 0 is being selected, a level "1"read signal RD is input to the read signal input terminal 22 of the memory 10, through the second selector 16. As a result of this, if the memory 10 is operating normally, data "1" that has been stored in the memory cell having address 0 being designated by the address signal Q4 will be read on to the external data bus 38 from the data input/output terminal 26.

(n) Next, a level "0" control signal INH is input to the control terminal 94 of the output control circuit 76. As a result, the output control circuit 76 outputs the second output data Q2 for designating address 2 that has been input from the input terminals 92 from the output control terminals 96 as third output data Q3.

Accordingly, the computing circuit 78 adds together the first output data Q1 for designating address 0 input from the first input terminals 98 and the third output data Q3 for designating address 2 input from the second input terminals 100. Address signal Q4 designating address 2 is output from the output terminals 102 as the result of addition. This address signal Q4 is input to the address input terminals 20 of the memory 10 via the first selector 14. As a result, the memory cell of the memory 10 having address 2 is designated again.

(o) When the memory cell having address 1 is being designated, a level "1" read signal RD is input to the read signal input terminal 22 of the memory 10 through the second selector 16. In this way, if the memory 10 is operating normally, data "0" that has been stored in the memory cell having address 2 being designated by the address signal is read on to the external data bus 38 from the data input/output terminal 26.

Figure 9:
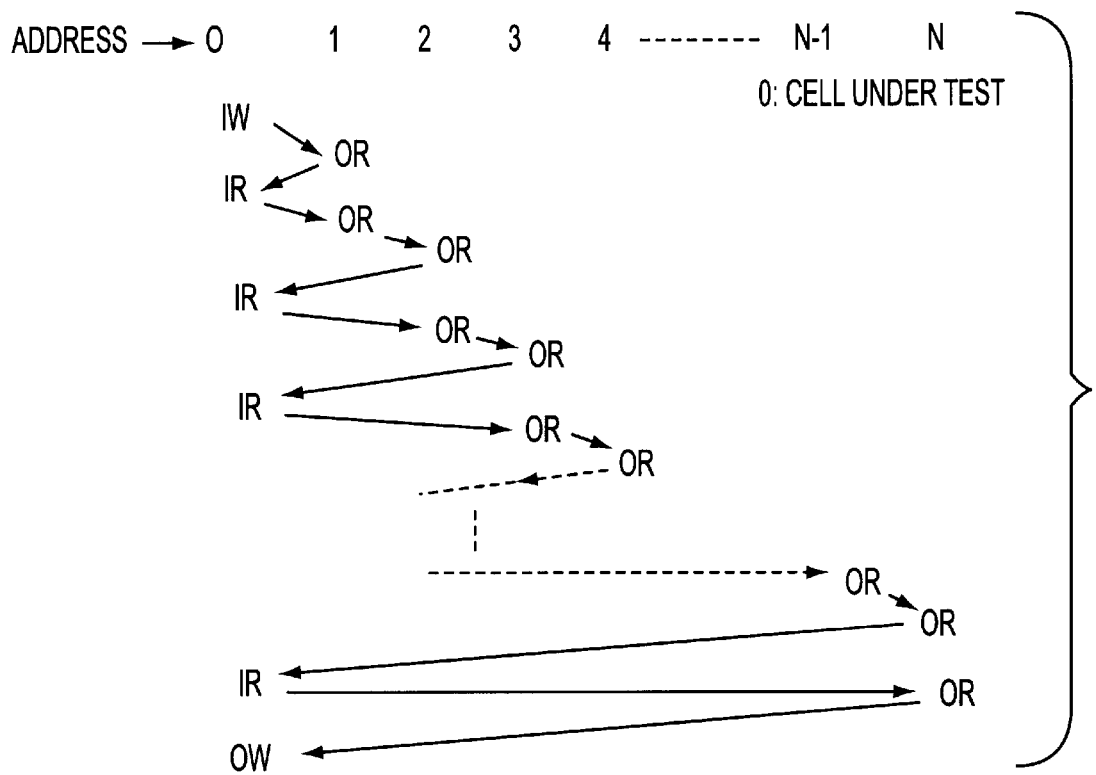
FIG. 9 is a drawing for describing the designating of memory cells using a "GALLOPING" test pattern.

Subsequently, in a similar manner memory cells are designated and read sequentially according to a "GALLOPING" pattern up to address N, in the same way as shown in FIG. 9. Specifically, when the cell under test is the memory cell having address 0, then after the memory cell having address 1 has been read once, the memory cells are read in the order address 0, address 1, address 2, address 0, address 2, address 3, address 0, address 3, address 4,. . . address 0, address N–1, address N. When there are a total of N memory cells in the memory 10, if the address is considered as a loop, then a memory cell having address N can be considered to be one cell before the memory cell under test having an address of 0. Further, address N+1 is equivalent to address 0.

(p) Next, level "0" is input as data to the memory cell under test having address 0 currently storing level "1" as data. At this point in time, the data in all the memory cells is level "0."

(q) Next, one pulse of the first clock signal CK1 at level "1" is input to the first clock signal input terminal 82 of the first counter 72. This causes the first output data Q1 of the first counter 72 to count up by one only. Accordingly, the first output data Q1 now designates address 1.

Also, one pulse of the second reset signal R2 at level "1"is input to the second reset signal input terminal 86 of the second counter 74. As a result of this, the second output data Q2 of the second counter 74 is initialized (that is, it is set to an address signal indicating address 0).

(r) Next, the external data bus 38 is set to level "1" and the write signal WR is also set to level "1". This write signal WR is input to the write signal input terminal 24 of the memory 10, via the third selector 18. As a result, level "1" is written as data to the memory cell of the memory 10 having address 1, which is the cell under test being designated by the address at that point in time.

With the memory cell having address 1 as the cell under test, the read operation of each memory cell other than the cell under test is tested by carrying out the same operations as (d)–(p) described above.

In this way, according to the first embodiment of the memory circuit 500, address signals designating addresses for the memory 10 are generated by the address signal generating means 70 at the time of testing. In order to generate the addresses, signals that are input from a tester external to the address signal generating means 70, for example, a first reset signal R1, a second reset signal R2, a first clock signal CK1, a second clock signal CK2 and a control signal INH, are all signals having periodicity. Thus, since the address signals are generated based on signals having periodicity, there is no need to carry out complex computation of address signals in a tester exclusively for the memory tests. Accordingly, since these signals having periodicity are input, a tester exclusively for a logic circuit can be used as the tester to be used in the memory tests. This means that with the memory circuit 500 there is no need to prepare a memory that has stored address signals depending on the test turn and sequentially inputting addresses from this memory, and there is no need to use a tester exclusively for memory tests.

Figure 3:
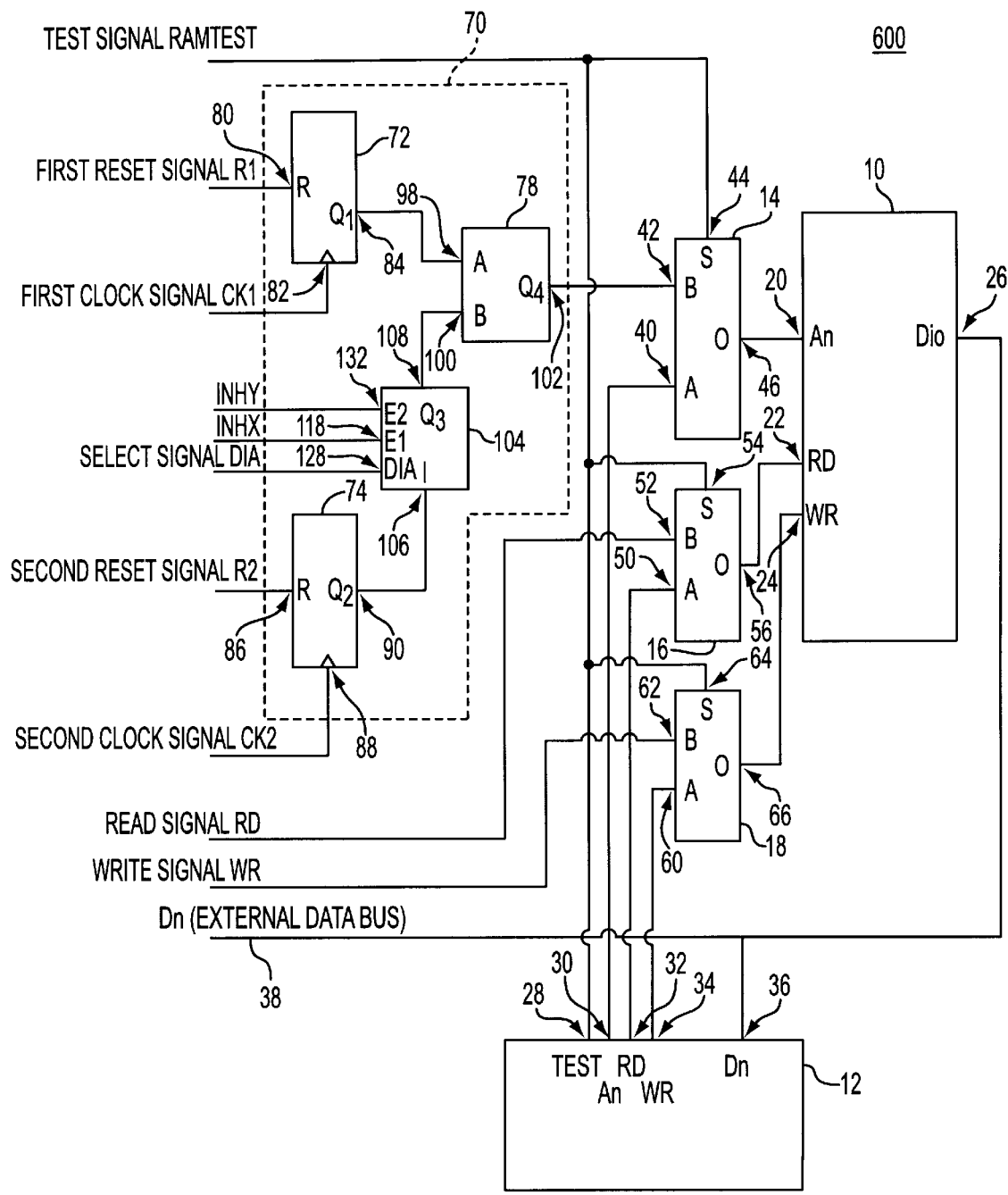
FIG. 3 is a schematic block diagram of a memory circuit of a second embodiment of the present invention.

Next, a memory circuit of a second embodiment of the present invention will be described with reference to the drawings. FIG. 3 is a schematic block diagram of a memory circuit of a second embodiment of the present invention.

The memory circuit 600 of FIG. 3 has the same structure as that of the memory circuit 500 of the first embodiment described above, except for the fact that the composition of the output control circuit 104 is different from the composition of the output control circuit 76 in the first embodiment shown in FIG. 1. Accordingly, in the second embodiment, parts that are the same as those in the first embodiment have the same reference numerals attached thereto, and the detailed description thereof will be omitted.

The output control circuit 104 is provided with input terminals 106 and output terminals 108. The second output data Q2 from the output terminals 90 of the second counter 74 is input to the input terminals 106. Third output data Q3 is output from the output terminals 108 to the second input terminals 100 of the computing circuit 78.

Figure 4:
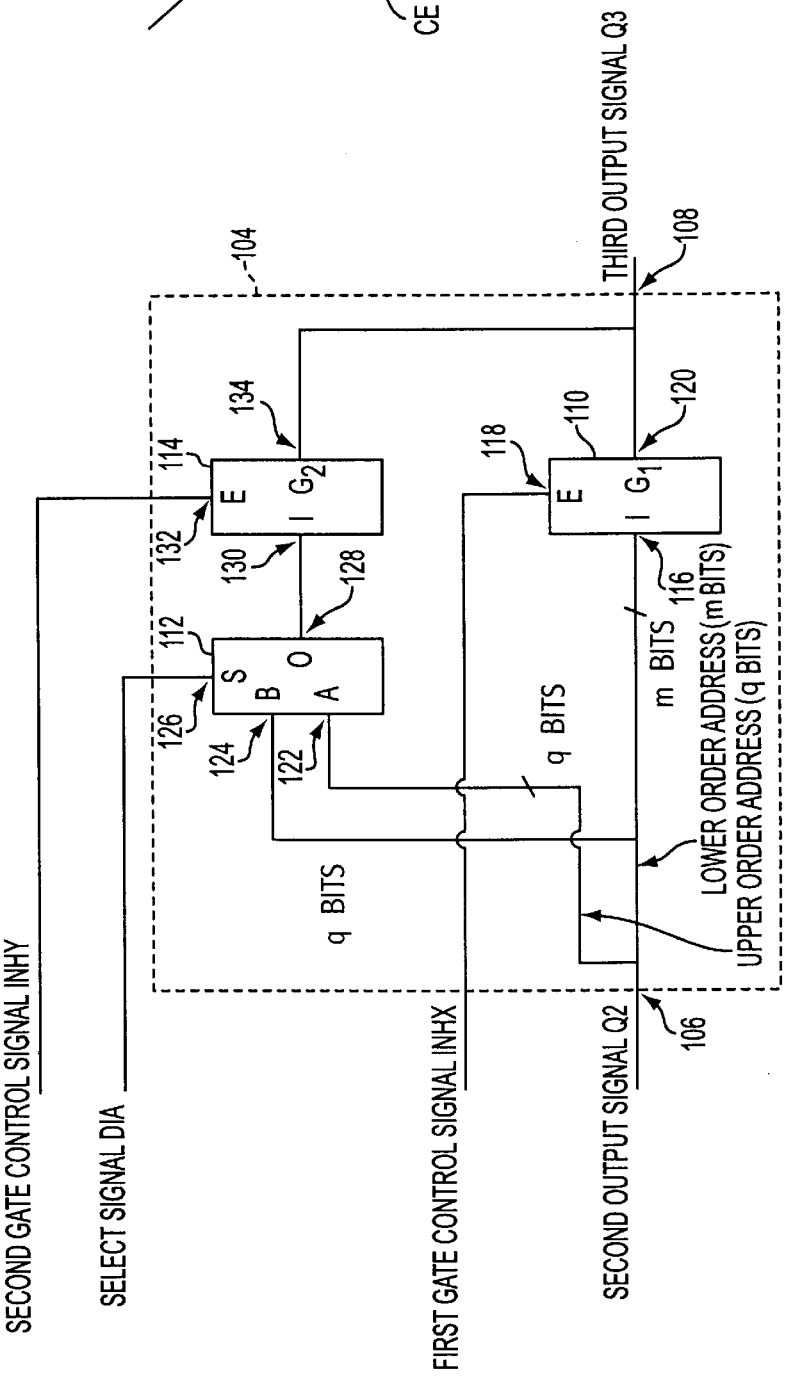
FIG. 4 is a schematic block diagram of an output control circuit in the memory circuit of FIG. 3.

A schematic block diagram of the output control circuit 104 is shown in FIG. 4. The output control circuit 104 comprises a first gate circuit 110 which is a first bit control circuit, a selector 112 constituting a select circuit, and a second gate circuit 114 which is a second bit control line.

The gate circuit 110 has input terminals 116, a control terminal 118, and output terminals 120. The input terminals 116 are connected to the input terminals 106 of the output control circuit 104. Part of address signal comprised of the second output data Q2 is input to the input terminals 116. For example, if the address signal has n bits, the lower order m bits terminals 116. A first gate control signal INHX from a tester external to the memory circuit 600 is input to the control terminal 118. The output terminals 120 are connected to the output terminals 108 of the output control circuit 104.

The lower order m bits are selectively output as a first gate output signal G1 from the output terminals 120 of the first gate circuit 110 depending on the first gate control signal INHX. The first gate output signal G1 makes up part of the third output data Q3.

The selector 112 is provided with first input terminals 122, second input terminals 124, a select terminal 126, and output terminals 128. The first input terminals 122 are connected to the input terminals 106 of the output control circuit 104. Part of the address signal comprised of the second output data Q2 is input to the first input terminals 122. For example, if the address signal is n bits the upper order q bits are input to the first input terminals 122 (namely, n=m+q). The second input terminals 124 are connected to the input terminals 106 of the output control circuit 104. The lower order q bits within the lower order m bits making up the second output data Q2 are input to the second input terminals 124. That is, if m ≧q, q bits from the lower side of the lower order m bits are input to the second input terminals 124. If m <q, the deficient portion (the upper order m–q bits) can be data at level "0," for example. A select signal DIA from the tester extern to the memory circuit 600 is input to the select terminal 126. The output terminals 128 of the selector 112 are connected to the second gate circuit 114. That is, the n bit third output data is made up of the m bit first gate output signal G1 and the q bit second gate output data G2.

The selector 112 selectively outputs either the upper order q bits that have been input from the first input from the first terminals 122 or the lower order q bits that have been input from the second input terminals 124 from the output terminals 128, depending on the select signal DIA.

The second gate circuit 114 is provided with input terminals 130, a control terminal 132 and control terminals 134. The input terminals 130 are connected to the output terminals 128 of the selector 112. The output of the selector 112 that has been output depending on the select signal DIA is input to the input terminals 130. A second gate control signal INHY from the tester external to the memory circuit 600 is input to the control terminal 132. The output terminals 134 are connected to the output terminals 108 of the output control circuit 104. The upper order q bits or the lower order q bits that have been input to the selector 112 are selectively output as a second gate output signal G2 from the output terminals 134 of the second gate circuit 114, depending on the second gate control signal INHY. The second gate output signal G2 form part of the third output data Q3. That is, the n bits of third output data are made up of the m bit first gate output signal G1 and the q bit second gate output signal G2.

The operation of the output control circuit 104 of the memory circuit 600 constituting the second embodiment of the present embodiment having the above described configuration will now be described.

(i) First of all, the case where the second output data Q2 that have been input to the output control circuit 104 are directly output as the third output data Q3 will be described.

In this case, the first gate control signal INFIX is first set to level "1." As a result, the lower order m bits of the second output data Q2 are output from the output terminals 120 of the first gate circuit 110 as the first gate output signal G1. Also, the select signal DIA is set to level "0." As a result, the upper order q bits of the second output data Q2 that have been input to the first input terminals 122 of the selector 112 are output from the output terminals 128. The second gate control signal INHY is set to level "1." As a result of this, the upper order q bits being output from the output terminals 128 of the selector 112 are output from the output terminals 134 of the second gate circuit 114 as the second gate output signal G2.

Figure 10:
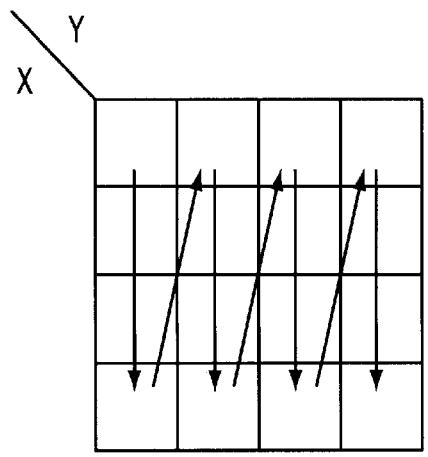
FIG. 10 is a memory cell layout drawing for describing the designating of cells under test using a "GALLOPING" test pattern.

Accordingly, in this case, the lower order m bits and the upper order q bits of the second output data Q2 that have been input to the output control circuit 104 are respectively directly output as the n bit address signal made up of the lower order m bits and upper order q bits of the third output data Q3. The upper order bits of this address signal are input to an X decoder and the lower order bits are input to a Y decoder. A specified memory cell is designated using the X decoder and the Y decoder. That is, within the plurality of memory cells arranged as shown in FIG. 10, the position of a memory cell corresponding to the address signal is designated using the X decoder and the Y decoder.

As a result, the memory circuit 600 in this case is capable of realizing the same operation as the memory circuit 500 of the first embodiment described above.

(ii) Next, a description will be given for the case where an address signal is generated for supplying the same amount of variation to both the X decoder and the Y decoder of the memory 10.

In this case, the select signal DIA is set to level "1" with the first gate control signal INHX and the second gate control signal INHY respectively still at level "1." In this way, the lower q bits from the low order m bits of the second output data Q2 that have been input to the second input terminals 124 of the selector 112 are output from the output terminals 128.

Accordingly, in this case the lower order q bits that are the same as the first gate output signal G1 are output as the second gate output signal G2. In the case where m>q, the input of the Y decoder is repeated from 0~$2_q$–1 in between each counting up of the remaining upper order (m–q) bits of the m bits that are input to the X decoder.

Figure 5:
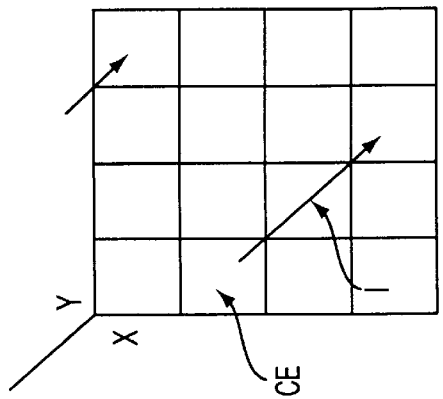
FIG. 5 is a cell layout drawing showing the direction of designating cells under test describing the operation of the output control circuit of FIG. 4.

FIG. 5 is a cell layout drawing showing the direction of designating the cell under test, for describing the operation of the output control circuit 104 of FIG. 4. FIG. 5 typically shows the layout of 16(4×4) memory cells. In FIG. 5 the positions in the vertical direction are designated by the X decoder, and those in the horizontal direction are designated by the Y decoder. Also, the same data is input to both the X decoder and the Y decoder using the output control circuit 104. As a result it is possible to move the memory cell designating position from memory cell CE in a diagonal direction to the lower right of the memory cell layout of FIG. 5. as shown by arrow I.

With the select signal DIA at level "1," if the first gate control signal INHX is set to level "0" it is possible to output only the upper order bits input to the Y decoder as the third output data Q3. As a result, with the X decoder fixed, it is possible to simply carry out tests on the memory cells in the designating direction of the Y decoder (the horizontal direction in FIG. 5). Conversely, if the second gate control signal INHY is set to level "0," it is possible to output only the lower order bits input to the X decoder, which means that with the Y decoder fixed it is possible to simply carry out tests for memory cells in the designating direction of the X decoder (the vertical direction in FIG. 5).

Figure 6:
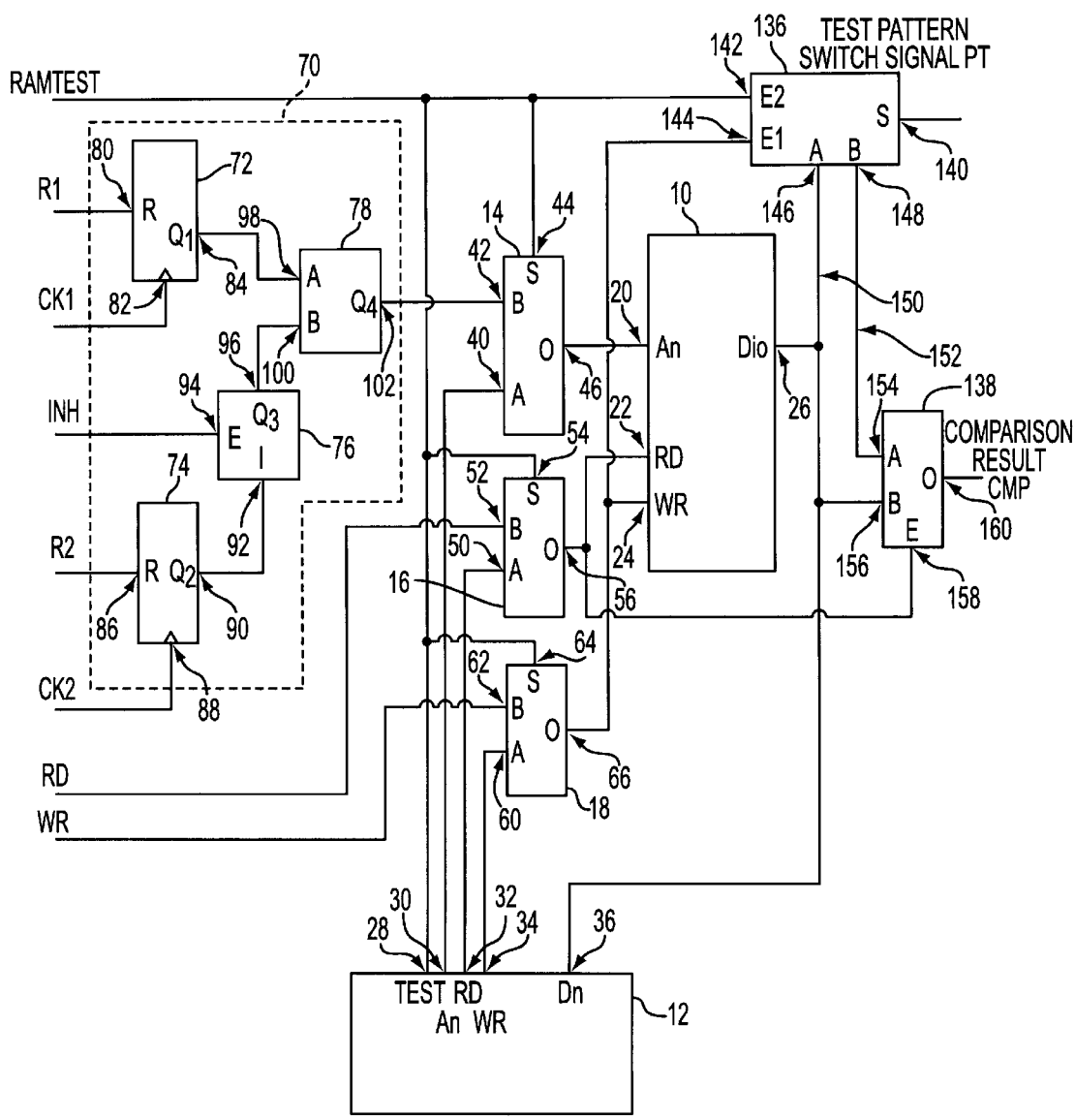
FIG. 6 is a schematic block diagram of a memory circuit of a third embodiment of the present invention.

Next, a memory cell circuit of a third embodiment of the present invention will be described with reference to the drawings. FIG. 6 is a schematic block diagram of a memory circuit of the third embodiment of the present invention.

The memory circuit 700 shown in FIG. 6 is the same as the memory circuit 500 of the above described first embodiment, except that there is provided a test pattern storage circuit 136, which is a pattern outputting circuit for outputting a test pattern for testing the memory 10, and a comparing circuit (comparator) 138. Accordingly, in the third embodiment, parts that are the same as those in the first embodiment are assigned the same reference numerals, and their detailed description will be omitted.

The test pattern storage circuit 136 stores set data values that should be output from the memory 10 and expected data values to be outputted by the memory 10 when the memory 10 is found to be operating normally through the memory tests. The comparison circuit 138 receives output data that have actually been output from the memory 10 that has been set to set values and expected data values that have been output from the test pattern storage circuit 136, and outputs a result of the comparison between this output data and the expected data in response to a comparison control signal.

The test pattern storage circuit 136 is provided with a switch terminal 140, a first control terminal 142, a second control terminal 144 a first output terminal 146 and a second output terminal 148.

A test pattern switching signal PT for switching the designation of a test pattern is input to the switch terminal 140 a tester external to the memory circuit 700. That is, when the test pattern storage circuit 136 stores expected data values for a plurality of different types of test pattern, for example four patterns, the test pattern switching signal PT is a 2 bit signal. A test signal RAMTEST is input to the first control terminal 142. The second control terminal 144 is connected to the output terminal 66 of the third selector 18. Accordingly, the write signal WR is input to the second control terminal 144 via the third selector 18. The first output terminal 146 is connected to the comparison circuit 138 via the data bus 150. Further, the expected data values of the test pattern that has been designated by the test pattern switching signal PT are usually output from the second output terminal 148.

The comparison circuit 138 is provided with a first input terminal 154, a second input terminal 156, a control terminal 158 and an output terminal 160. The first input terminal 154 is connected the second output terminal 148 of the test pattern storage circuit 136 via the data bus 152.

The second input terminal 156 is connected to the data input/output terminal 26 of the memory 10 via the data bus 152. Output data of the memory 10 that has been set with set values of a test pattern are input to this second input terminal 156.

The control terminal 158 is connected to the output terminal 56 of the second selector 16. Accordingly, the read signal RD is input to the control terminals 158 via the second selector 16.

The output terminal 160 is connected to, for example, a tester external to the memory circuit 700. This output terminal 160 outputs a result of comparison CMP between output data that has been input from the first input terminal 154 and expected data that has been input from the second input terminal 156. The operation of the memory circuit 700 of the third embodiment of the present invention having the above described structure will now be described.

First of all, fixed values of a test pattern are designated by the test pattern switching signal PT. Expected data for these set values are usually input from the second output terminal 148 of the test pattern storage circuit 136 to the first input terminal 154 of the comparison circuit 138.

The test signal RAMTEST at level "1" is input to the first control terminal 142 and the write signal WR at level "1" is input to the second control terminal 144 via the third selector 18. In this way, expected values that have been designated by the test pattern switching signal PT are output from the first output terminal 146 of the test pattern storage circuit 136. The expected data values that have been output from the first output terminal 146 are then input to the data input/output terminal 26 of the memory 10 through the data bus 150 to be written into the memory 10. Expected values are output from the first output terminals 146 only in the case where the test signal RAMTEST and the write signal WR are both at level "1." An address signal for designating a memory cell of the memory 10 is input to the address input terminals 20 via the first selector 14.

Next, the write signal WR at level "0" is input to the second control terminal 144, and as a result output of expected values from the first output terminal 146 of the test pattern storage circuit 136 is stopped.

The read signal RD at level "1" is then input to the read signal input terminal 22 of the memory 10 via the second selector 16. In this way, output data of the expected values that have been designated by the test pattern switching signal PT are read out by being output from the data input/output terminal 26 of the memory 10. This output data is input to the second input terminal 156 of the comparison circuit 138 via the data bus 150.

The comparison circuit 138 that has been activated in response to the read signal RD then compares expected data values that have been input from the first input terminal 154 and set data pattern values that have been input from the second input terminal 156. The result of this comparison CMP is output as a level "0" signal if the output data and the expected value data match, or as a level "1" signal if the output data and the expected value data do not match.

Accordingly, according to the memory circuit 700 of the third embodiment, the memory test can be carried out easily by the tester checking only that the comparison result CMP is a level "1."

In the first embodiment, input and output of data to and from the data input/output terminal 26 of the memory 10 were both carried out via the external data bus. In this case, because set values were input from outside the memory circuit a set up time and a hold time were required. Also, time was required to stabilize the output from the memory 10 to the data bus since the output data also switches between level "1" and level "0" a number of times.

In the third embodiment, however, set values are input from the test pattern storage circuit 136 to the memory 10, and output data is input from the memory 10 to the comparison circuit 138. This means that in the third embodiment the time required as a set up time and a hold time can be reduced. Further, it is possible to detect only that the result of comparison CMP output from the comparison circuit 138 does not match (for example, only the case of a to level "0" signal). Accordingly, it possible to reduce the time required as a data output stabilizing time. What this means in actual fact is that the memory tests can be carried out at a speed close to the maximum operating speed of the memory 10.

Figure 7:
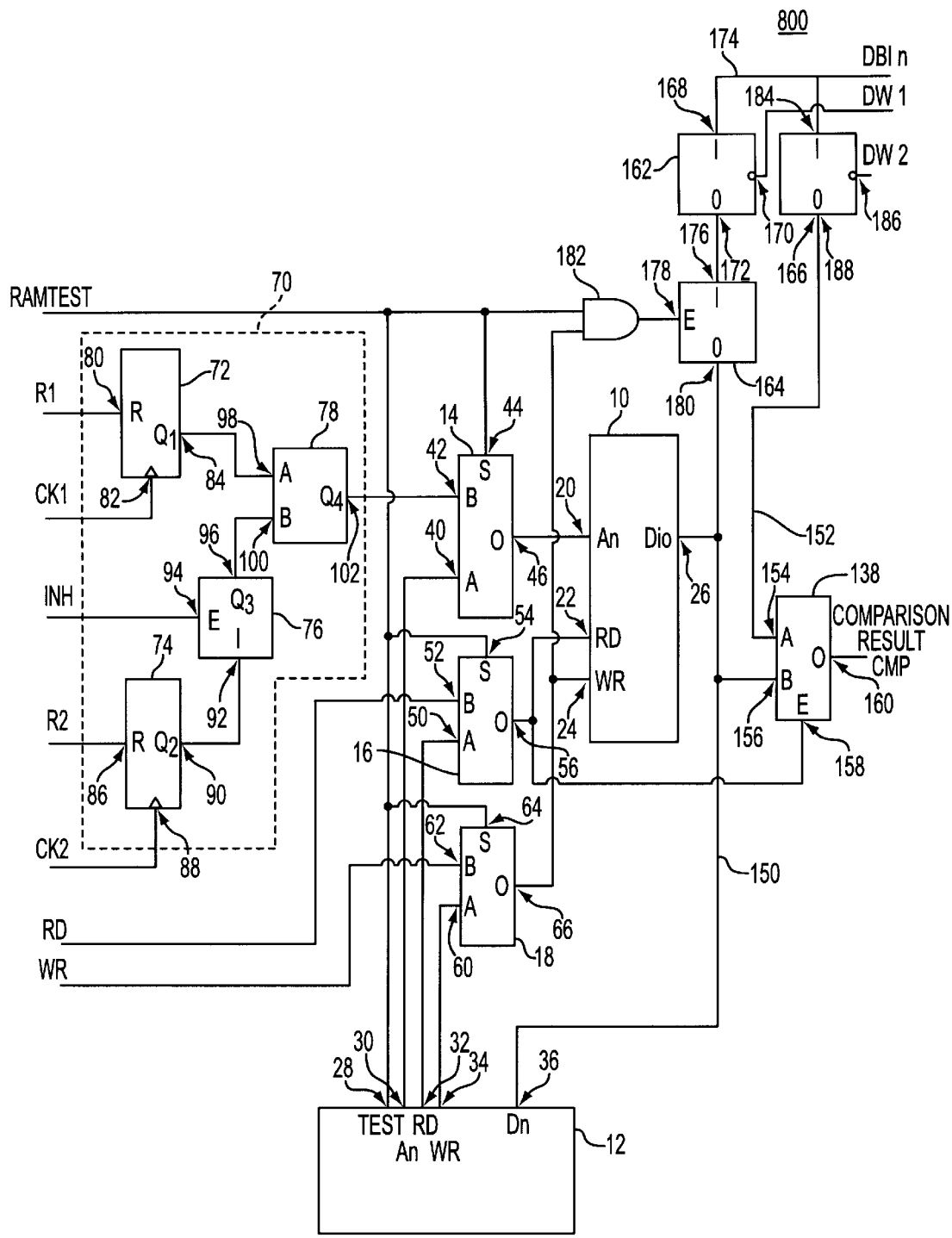
FIG. 7 a schematic block diagram of a memory circuit of a fourth embodiment of the present invention.

Next, a memory circuit of a fourth embodiment of the present invention will be described with reference to the drawings. FIG. 7 is a schematic block diagram of a memory circuit illustrating the fourth embodiment of the present invention.

The memory circuit 800 of FIG. 7 has the same construction as the third embodiment described above except that a first register 162 constituting a first transfer circuit, a buffer 164, a second register 166 constituting a second transfer circuit, and an AND gate 182 are provided in place of the test pattern storage circuit 136. Accordingly, parts of the fourth embodiment that have the same construction as those in the third embodiment have the same reference numerals attached thereto, and the detailed description thereof will be omitted.

The memory circuit 800 of the fourth embodiment is provided with the first register 162, the buffer 164, the second register 166 and a comparison circuit 138.

The first register 162 is provided with an input terminal 168, a clock terminal 170 and an output terminal 172. Fixed values of a test pattern constituting data of each memory cell of the memory 10 are input to the input terminal 168 from a tester external to the memory 10, via the data bus 174. A first register control signal DWI is input to the clock terminal 1 70. The output terminal 172 is connected to the buffer 164.

This first register 162 is input with fixed values from the input terminal 168 according to the first register control signal DWI.

The buffer 164 is provided with an input terminal 176, a control terminal 178 and an output terminal 180. Set values are input from the output terminal 172 of the first register 162 to the input terminal 176. An output signal from the AND gate 182 is input to the control terminal 178. This AND gate 182 has inputs of the test signal RAMTEST and the write signal WR. Accordingly, when the respective signals are level "1," namely when a level "1" write signal WR is input at the time of memory tests, a level "1" output signal is output from the AND gate 182 to the control terminal 178. The output terminal 180 is connected to the data input/output terminal 26 of the memory 10.

This buffer 164 outputs the set values that have been input from the input terminal 176 from the output terminal 180 according to the output signal of the AND gate 182.

The second register 166 is provided with an input terminal 184, a clock terminal 186 and an output terminal 188. When the memory is found to be operating normally as a result of the memory tests, expected value data constituted by data output from the memory circuit 800 that has been set to a fixed value, are input to the input terminal 184 via the data bus 174.

A second control signal DW2 is input to the clock terminal 186. The output terminal 188 is connected to a first input terminal 154 of the comparison circuit 138.

The second register 166 is input with expected value data from the input terminal 184, according to the second control signal DW2.

The comparison circuit 138 is provided with an output terminal 134, a second input terminal 156, a control terminal 158 and an output terminal 160. The first input terminal 154, is connected to the output terminal 188 of the second register 166, via the data bus 152. The second input terminal 156 is connected to the data input/output terminal 26 of the memory 10 via the data bus 150. Output data of the memory 10 that has been set to set values of a test pattern are input to the second input terminal 156. The read signal RD is connected to the control terminal 158. The output terminal 160 is connected to a tester external to the memory circuit 800, for example.

This comparison circuit 138 outputs a result of comparison CMP, between the data that has been output from the first input terminal 154 and expected value data that has been input from the second input terminal 156, from the output terminal 160.

The operation of the memory circuit 800 of the present invention having the above described construction will now be described. In the memory circuit 800, set values and expected data values for these set values are set externally from the memory circuit 800.

First of all, before the memory tests, set values are input to the input terminal 168 of the first register 162 from the data bus 174, by inputting a level "1" first control signal DWI to the clock terminal 170 of the first register 162. The set values are input to the input terminal 176 of the buffer 164 from the output terminal 172 of the first register 162. The buffer 164 stores and outputs these set values.

Also before the memory tests, expected data values are input from the data bus 174 to the input terminal 184 of the second register 166 by inputting a level "1" second control signal DW2 to the clock terminal 186 of the second register 166. The second register 166 stores and outputs the expected value data. Accordingly, the expected value data is input to the first input terminal 154 of the comparison circuit 138 from the output terminal 188 of the second register 166.

Next, a level "1" test signal RAMTEST and a level "1" write signal WR arc respectively input to the AND gate 182. In this way, a level "1" output signal is input is input to the control terminal 178 of the buffer 164 from the AND gate 182. The buffer 164 to which the level "1" output signal has been input outputs set values from the output terminal 180. The set values that have been output from the output terminal 180 are written to the memory 10 by being input to the data input/output terminal 26 of the memory 10.

A level "1" read signal RD is then input to the read signal input terminal 22 of the memory 10. As a result, the set value output data is read out from the data input/output terminal 26 of the memory 10. This output data is input to the second input terminal 156 of the comparison circuit 138 via the data bus 150. Because the AND gate 182 outputs a level "0" signal, output from the buffer 164 is inhibited.

Next, at the comparison circuit 138, the expected data that has been input from the first input terminal 154 is compared with the set values of the test pattern that have been input from the second input terminal 156. The result of this comparison CMP is output from the output terminal 160. If the output data and the expected values match, the result of comparison CMP is output as a level "0" signal, while if the output data and the expected values do not match it is output as a level "1" signal.

Thus, according to the fourth embodiment of the present invention, memory tests can be carried out easily by the tester simply checking whether the result of comparison CMP is level "1."

As described above, according to the fourth embodiment, an operator can carry out memory tests with an arbitrary test pattern depending on the situation, using the first register 162 and the second register 166.

In each of the embodiments described above, descriptions have been given only for examples that have been constructed in specific conditions using the particular materials according to the present invention, but various changes and modifications are possible. For example, in the above described embodiments a "GALLOPING" test pattern has been employed, but various other test patterns, such as "CHECKERBOARD" or "MARCHING," can also be used in the present invention.

Further, the present invention can operate with the level "0" and level "1" of the signals switched.

As has been described above, the present invention is suitable for use with a memory circuit for executing memory tests, and particularly memory tests that are required to cyclically designate memory cells.

What is claimed is:

1. A memory test circuit, for a memory circuit having a plurality of memory cells, for executing specified tests on memory cells that have been designated by address data, the memory test circuit comprising:

a first data generating circuit, which receives a first clock signal, for generating a sequence of first data for generating said address data for designating a memory cell under test for a plurality of memory cells of said memory circuit and outputting said first data, said first data corresponding to a counted number of pulses of said first clock signal;

a second data generating circuit, which receives a second clock signal, for generating a sequence of second data for generating said address data for designating a plurality of memory cells of said memory circuit and outputting said second data, said second data corresponding to a counted number of pulses of said second clock signal;

a control circuit, which receives a control signal, for selectively outputting said second data or predetermined data, as third data in response to said control signal; and an arithmetic circuit, which receives said first data and said third data, for carrying out an arithmetic operation based on said first data and said third data, and outputting a result of said arithmetic operation as said address data.

2. The memory test circuit as claimed in claim 1, wherein said arithmetic circuit carries out addition processing.

3. The memory test circuit as claimed in claim 1, wherein said first data generating circuit and said second data generating circuit comprise counters.

4. The memory test circuit as claimed in claim 3, wherein said counters are resettable.

5. The memory test circuit as claimed in claim 1, further comprising a comparison circuit for comparing data that has been read out from a memory cell designated by said address data with expected value data for the memory cells, and outputting a result of the comparison.

6. The memory test circuit as claimed in claim 5, further comprising a pattern output circuit for outputting said expected value data for said plurality of memory cells, and transmitting fixed test patterns to said memory circuit in response to a switch signal.

7. The memory test circuit as claimed in claim 5, further comprising a first transfer circuit for outputting said expected value data for said plurality of memory cells that are input from outside in response to a first transfer signal, and a second transfer circuit for outputting arbitrary test pattern data input from outside to said memory circuit in response to a second transfer circuit.

8. A memory test circuit, for a memory circuit having a plurality of memory cells, for executing specified tests on memory cells that have been designated by address data, the memory test circuit comprising:

a first data generating circuit, which receives a first clock signal, for generating a sequence of first data for generating said address data for designating a memory cell under test for a plurality of memory cells of said memory circuit and outputting said first data, said first data corresponding to a counted number of pulses of said first clock signal;

a second data generating circuit, which receives a second clock signal, for generating a sequence of second data for generating said address data for designating a plurality of memory cells of said memory circuit and outputting said second data, said second data corresponding to a counted number of pulses of said second clock signal;

a control circuit, which receives a control signal, for selectively outputting said second data or a data generated based on said second data, as third data in response to said control signal; and an arithmetic circuit, which receives said first data and said third data, for carrying out an arithmetic operation based on said first data and said third data, and outputting a result of said arithmetic operation as said address data.

9. The memory test circuit as claimed in claim 8, wherein said second data has n bits, and wherein said control circuit has a function of replacing data of q high order bits of said second data (where q is less than n) with q lower order bits.

10. The memory test circuit as claimed in claim 9, wherein said control signal is comprised of a first control signal and a second control signal, and said control circuit comprises:

a first bit control circuit for controlling output of a lower order m bits of said second data in response to said first control signal;

a select circuit for selectively outputting q high order bits or q lower order bits within said n bits in response to said second control signal; and a second bit control circuit for controlling output of said select circuit in response to said second control signal.

11. A memory test circuit for testing a memory circuit having addressable memory cells, comprising:

means for counting pulses of a first clock signal to generate first digital data;

means for generating additional digital data, the means for generating additional digital data including means for counting pulses of a second clock signal to generate second digital data; and means for adding the first digital data and the additional digital data to generate addresses for addressing the memory circuit.

12. The memory test circuit as claimed in claim 11, wherein the means for generating additional digital data further includes means responsive to a control signal for outputting either zero or the second digital data as the additional digital data.

13. The memory test circuit as claimed in claim 11, wherein the means for generating additional digital data further includes means for selectively modifying the second digital data to form the additional digital data.

14. The memory test circuit as claimed in claim 13, wherein the additional digital data has n bits, and wherein the means for selectively modifying comprises means for selecting q high-order bits of the additional digital data (q<n) or q low-order bits of the additional digital data in response to a selection signal.

15. The memory test circuit as claimed in claim 11, further comprising means for comparing data read out of the memory circuit with expected data.

* * * * *